US011783892B2

(12) United States Patent
Lee

(10) Patent No.: US 11,783,892 B2
(45) Date of Patent: Oct. 10, 2023

(54) SEMICONDUCTOR MEMORY DEVICE

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/559,891

(22) Filed: Dec. 22, 2021

(65) Prior Publication Data

US 2022/0115056 A1   Apr. 14, 2022

Related U.S. Application Data

(62) Division of application No. 16/848,304, filed on Apr. 14, 2020, now Pat. No. 11,244,719.

(30) Foreign Application Priority Data

Nov. 6, 2019  (KR) .................... 10-2019-0140888

(51) Int. Cl.
*G11C 5/06* (2006.01)
*G11C 11/4097* (2006.01)
*G11C 11/4094* (2006.01)
*G11C 11/4074* (2006.01)

(52) U.S. Cl.
CPC ............ *G11C 11/4097* (2013.01); *G11C 5/06* (2013.01); *G11C 11/4074* (2013.01); *G11C 11/4094* (2013.01); *G11C 2211/4016* (2013.01)

(58) Field of Classification Search
CPC ... G11C 11/4097; G11C 5/06; G11C 11/4074; G11C 11/4094; G11C 2211/4016

USPC ......................................................... 365/63
See application file for complete search history.

(56) References Cited

U.S. PATENT DOCUMENTS

| 9,000,510 | B2 |   | 4/2015  | Hong    |               |
|-----------|----|---|---------|---------|---------------|
| 9,318,502 | B2 | * | 4/2016  | Son     | ....... H01L 23/535 |
| 9,653,562 | B2 | * | 5/2017  | Kim     | ....... H01L 27/11529 |
| 9,761,606 | B1 | * | 9/2017  | Ishida  | ....... H01L 27/11573 |
| 9,847,341 | B2 | * | 12/2017 | Shin    | ....... H01L 27/11575 |
| 10,199,326| B1 | * | 2/2019  | Ohsaki  | ....... H01L 21/76898 |
| 10,243,001| B2 | * | 3/2019  | Choi    | ....... H01L 27/11556 |
| 10,468,422| B2 | * | 11/2019 | Lee     | ....... H01L 28/00 |
| 10,504,918| B2 | * | 12/2019 | Shimojo | ....... H01L 27/11548 |
| 10,651,153| B2 | * | 5/2020  | Fastow  | ....... G11C 16/08 |
| 10,707,231| B2 | * | 7/2020  | Park    | ....... H01L 23/481 |
| 10,741,577| B2 | * | 8/2020  | Lee     | ....... H01L 27/11568 |
| 10,804,289| B2 | * | 10/2020 | Yang    | ....... H01L 27/11582 |
| 10,861,863| B2 | * | 12/2020 | Kim     | ....... H01L 27/11529 |
| 10,991,717| B2 | * | 4/2021  | Baek    | ....... H01L 27/11582 |

(Continued)

FOREIGN PATENT DOCUMENTS

| KR | 1020100095723 A | 9/2010 |
|----|-----------------|--------|
| KR | 1020160094117 A | 8/2016 |

(Continued)

*Primary Examiner* — Viet Q Nguyen
(74) *Attorney, Agent, or Firm* — WILLIAM PARK & ASSOCIATES LTD.

(57) ABSTRACT

A semiconductor memory device includes a substrate including a logic circuit, a memory cell array disposed over the substrate, a first conductive group including a plurality of bit lines and a first upper source line that are coupled to the memory cell array and spaced apart from each other and a first upper wire that is coupled to the logic circuit, an insulating structure covering the first conductive group.

10 Claims, 12 Drawing Sheets

(56) References Cited

U.S. PATENT DOCUMENTS

| | | | |
|---|---|---|---|
| 10,998,301 B2* | 5/2021 | Kanamori | H01L 27/11582 |
| 11,094,704 B2* | 8/2021 | Zhang | H01L 25/0657 |
| 11,094,904 B2* | 8/2021 | Kim | H01L 27/3246 |
| 11,152,387 B2* | 10/2021 | Lim | H01L 27/11556 |
| 2009/0242968 A1 | 10/2009 | Maeda et al. | |
| 2013/0294168 A1 | 11/2013 | Shirakawa | |
| 2014/0085979 A1 | 3/2014 | Kono | |
| 2015/0076578 A1 | 3/2015 | Sakamoto et al. | |
| 2016/0064406 A1 | 3/2016 | Natori et al. | |
| 2016/0079259 A1 | 3/2016 | Son et al. | |
| 2016/0099256 A1 | 4/2016 | Okamoto | |
| 2016/0126251 A1 | 5/2016 | Fujita et al. | |
| 2016/0163732 A1 | 6/2016 | Lim et al. | |
| 2016/0322376 A1 | 11/2016 | Lee | |
| 2017/0062455 A1 | 3/2017 | Nomura | |
| 2017/0103992 A1 | 4/2017 | Hachisuga et al. | |
| 2017/0213845 A1 | 7/2017 | Baba | |
| 2017/0263639 A1 | 9/2017 | Saito et al. | |
| 2017/0271364 A1 | 9/2017 | Sakuma et al. | |
| 2017/0330887 A1 | 11/2017 | Kim et al. | |
| 2018/0082750 A1 | 3/2018 | Ikeda et al. | |
| 2018/0211995 A1 | 7/2018 | Bak et al. | |
| 2018/0294225 A1 | 10/2018 | Lee et al. | |
| 2019/0393238 A1 | 12/2019 | Lim et al. | |
| 2020/0126991 A1 | 4/2020 | Yamazaki et al. | |
| 2020/0194453 A1 | 6/2020 | Lim | |
| 2020/0251149 A1 | 8/2020 | Zhang et al. | |
| 2020/0357811 A1 | 11/2020 | Kim et al. | |
| 2020/0365617 A1 | 11/2020 | Ahn et al. | |
| 2021/0065801 A1 | 3/2021 | Kwon et al. | |

FOREIGN PATENT DOCUMENTS

| | | |
|---|---|---|
| KR | 1020180135642 A | 12/2018 |
| KR | 1020190091672 A | 8/2019 |

* cited by examiner

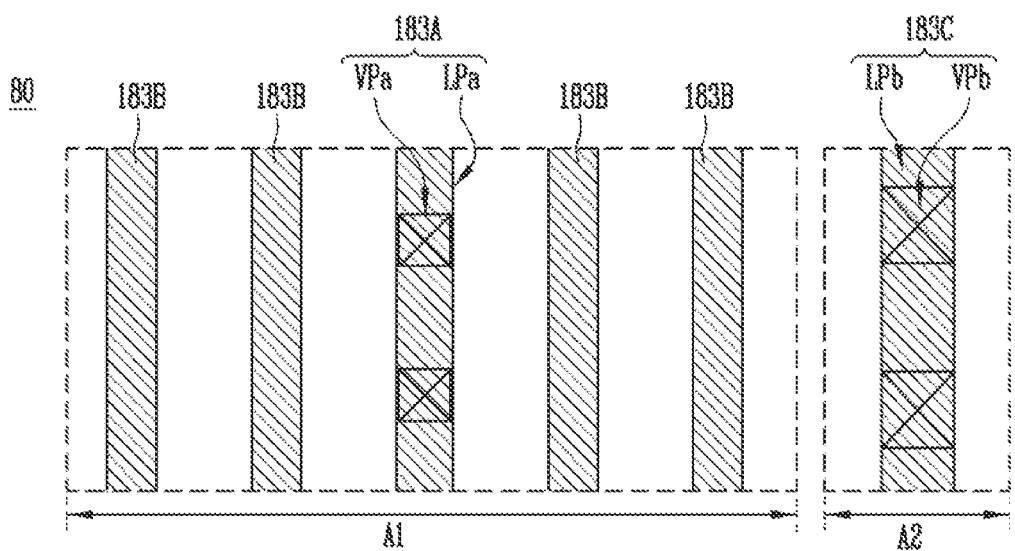
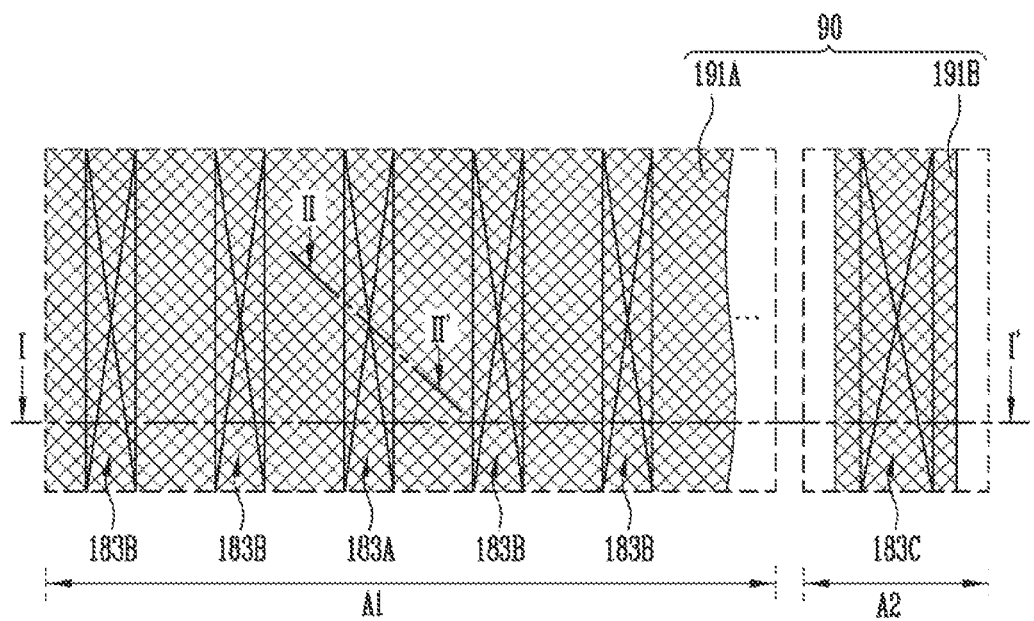

SEMICONDUCTOR MEMORY DEVICE

CROSS-REFERENCE TO RELATED APPLICATION

The present application is a divisional application of U.S. patent application Ser. No. 16/848,304, filed on Apr. 14, 2020, and claims priority under 35 U.S.C. § 119(a) to Korean patent application number 10-2019-0140888, filed on Nov. 6, 2019, in the Korean Intellectual Property Office, the entire disclosure of which is incorporated herein by reference.

BACKGROUND

1. Technical Field

Various embodiments generally relate to a semiconductor memory device, and more particularly, to a semiconductor memory device including a memory cell array coupled to bit lines.

2. Related Art

A semiconductor memory device may include a memory cell array including memory cells that may store data and a peripheral circuit controlling the operations of the memory cell array. The memory cell array and the peripheral circuit may be coupled to wires that transfer signals for driving the semiconductor memory device.

SUMMARY

According to an embodiment, a semiconductor memory device may include a substrate including a logic circuit, a memory cell array disposed over the substrate, a first conductive group including a plurality of bit lines and a first upper source line that are coupled to the memory cell array and spaced apart from each other and a first upper wire that is coupled to the logic circuit, an insulating structure covering the first conductive group, a second conductive group including a second upper source line and a second upper wire and disposed over the insulating structure, and an upper source contact portion embedded in the insulating structure.

According to an embodiment, a semiconductor memory device may include a channel structure extending from a lower source line, a gate stack structure including interlayer insulating layers and conductive patterns that surround the channel structure and are alternately stacked on each other, a lower source contact portion extending in parallel with the channel structure from the lower source line, a bit line overlapping the gate stack structure and coupled to the channel structure, a first upper source line coupled to the lower source contact portion.

BRIEF DESCRIPTION OF THE DRAWINGS

FIGS. 5 and 6 are plan views illustrating a second contact group according to an embodiment;

FIG. 7 is a plan view illustrating a second conductive group according to an embodiment;

DETAILED DESCRIPTION

The specific structural or functional descriptions disclosed herein are merely illustrative for the purpose of describing embodiments according to the concept of the present disclosure. The embodiments according to the concept of the present disclosure may be implemented in various forms, and should not be construed as limited to the embodiments set forth herein.

Various embodiments may be directed to a semiconductor memory device capable of reducing constraints with respect to upper wires.

Figure 1:
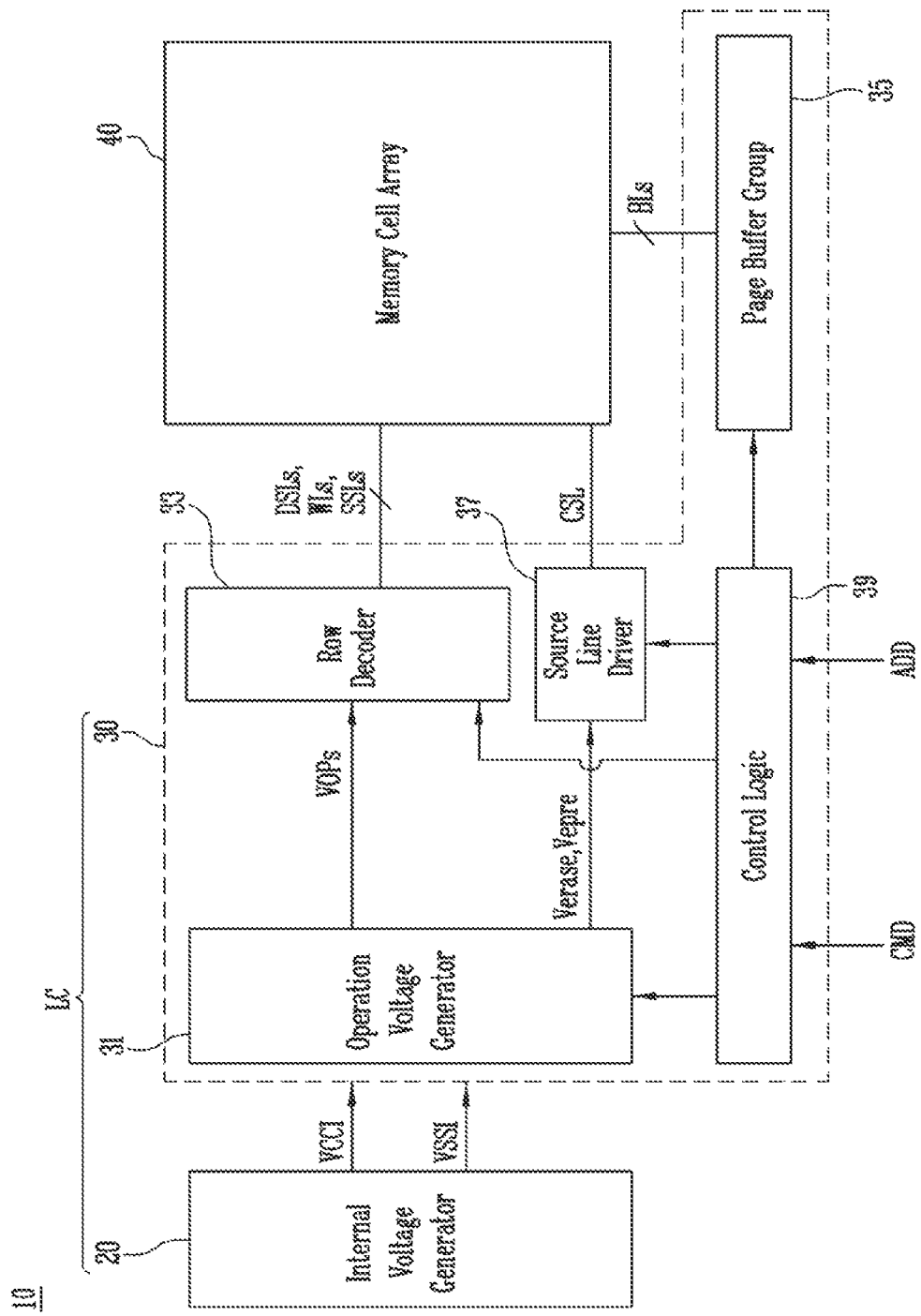
FIG. 1 is a block diagram illustrating a semiconductor memory device according to an embodiment.

FIG. 1 is a block diagram illustrating a semiconductor memory device 10 according to an embodiment.

Referring to FIG. 1, the semiconductor memory device 10 may include a logic circuit LC and a memory cell array 40. The logic circuit LC may include an internal voltage generator 20 and a peripheral circuit 30.

The internal voltage generator 20 may be configured to receive an external voltage to generate various internal voltages. The internal voltages output from the internal voltage generator 20 may be supplied to the peripheral circuit 30. According to an embodiment, internal voltages may include an internal power voltage VCCI and an internal ground voltage VSSI.

The peripheral circuit 30 may be configured to perform a program operation to store data in the memory cell array 40, a read operation to output the data stored in the memory cell array 40, and an erase operation to erase the data stored in the memory cell array 40. Internal voltages used to activate the peripheral circuit 30 may be supplied from the internal voltage generator 20 to the peripheral circuit 30.

According to an embodiment, the peripheral circuit 30 may include control logic 39, an operation voltage generator 31, a row decoder 33, a source line driver 37, and a page buffer group 35.

The memory cell array 40 may include a plurality of memory blocks. Each of the memory blocks may be coupled to one or more drain select lines DSLs, a plurality of word lines WLs, one or more source select lines SSLs, a plurality of bit lines BLs, and a common source structure CSL.

The control logic 39 may control the peripheral circuit 30 in response to a command CMD and an address ADD. The control logic may be implemented in hardware, software, or a combination thereof. For example, the control logic may be realized as a control logic circuit operating in accordance with an algorithm.

The operation voltage generator 31 may generate various operation voltages VOPs used to perform a program operation, a read operation, and an erase operation in response to the control of the control logic 39. The operation voltages VOPs may include a program voltage, a verify voltage, a pass voltage, a select line voltage, and the like.

The row decoder 33 may select a memory block in response to the control of the control logic 39. The row decoder 33 may be configured to apply the operation voltages VOPs to the drain select lines DSLs, the word lines WLs, and the source select lines SSLs coupled to the selected memory block.

The source line driver 37 may be coupled to the memory cell array 40 through the common source structure CSL. The source line driver 37 may be configured to perform a discharge operation of the common source structure CSL in response to the control of the control logic 39. The source line driver 37 may apply a pre-erase voltage Vepre and an erase voltage Verase to the common source structure CSL during an erase operation in response to the control of the control logic 39. The pre-erase voltage Vepre and the erase voltage Verase may be generated in the operation voltage generator 31.

The page buffer group 35 may be coupled to the memory cell array 40 through the bit lines BLs. The page buffer group 35 may temporarily store data received from an input/output circuit (not illustrated) during a program operation in response to the control of the control logic 39. The page buffer group 35 may sense a voltage or a current of the bit lines BLs during a read operation or a verify operation in response to the control of the control logic 39. The page buffer group 35 may selectively float the bit lines BLs in response to the control of the control logic 39.

Figure 2:
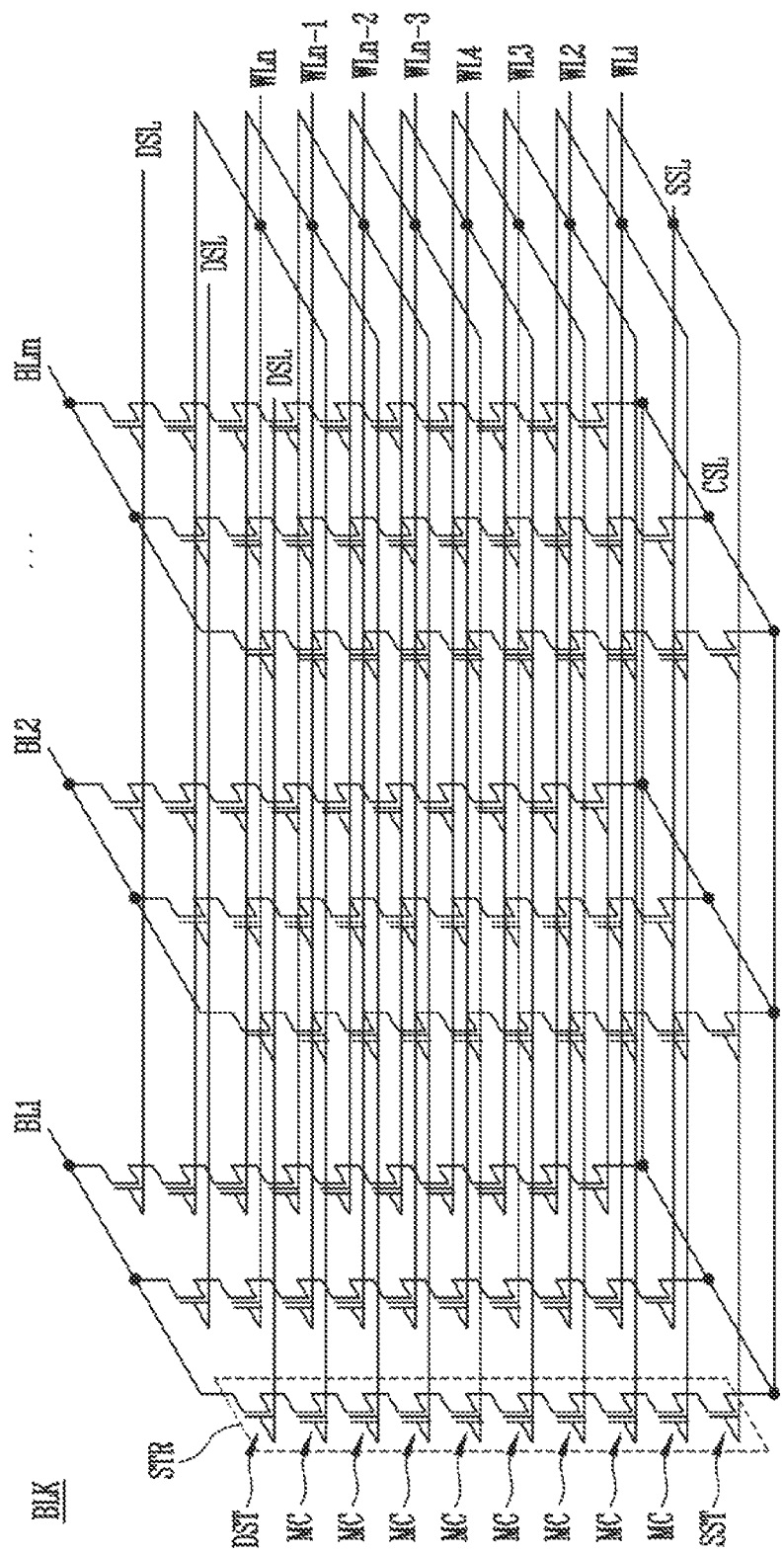
FIG. 2 is an equivalent circuit diagram illustrating a memory block according to an embodiment.

FIG. 2 is an equivalent circuit diagram illustrating a memory block BLK according to an embodiment.

Referring to FIG. 2, the memory block BLK may include a plurality of memory cell strings STR coupled in common to the common source structure CSL. The memory cell strings STR may be coupled to a plurality of bit lines BL1 to BLm. The memory cell strings STR may be classified into a plurality of column groups respectively coupled to the plurality of bit lines BL1 to BLm. The memory cell strings STR of each of the column groups may be coupled in parallel to a bit line corresponding thereto.

Each of the memory cell strings STR may include one or more drain select transistor coupled to a corresponding bit line, one or more source select transistor coupled to the common source structure CSL, and a plurality of memory cells coupled in series between the drain select transistor and the source select transistor. A gate of the drain select transistor may be coupled to a drain select line corresponding thereto, a gate of each of the memory cells may be coupled to a word line corresponding thereto, and a gate of the source select transistor may be coupled to a source select line corresponding thereto.

According to an embodiment, each of the memory cell strings STR may be coupled to the drain select line DSL, a plurality of word lines WL1 to WLn, and the source select line SSL. Each of the memory cell strings STR may include a drain select transistor DST coupled to the drain select line DSL, a plurality of memory cells MC coupled to the word lines WL1 to WLn, and a source select transistor SST coupled to the source select line SSL. The memory cells MC of each of the memory cell strings STR may be coupled in series.

The memory cells MC coupled in series and the bit line corresponding thereto may be coupled to each other through the drain select transistor DST. The drain select transistor DST may include a junction coupled to the bit line corresponding thereto. The memory cells MC coupled in series and the common source structure CSL may be coupled to each other through the source select transistor SST. The source select transistor SST may include a junction coupled to the common source structure CSL.

A structure of each of the memory cell strings STR is not limited to the embodiment shown in FIG. 2. According to an embodiment, each of the memory cell strings STR may include two or more drain select transistors coupled in series to a bit line corresponding thereto. According to this embodiment, two or more layers of drain select lines may be disposed between the bit lines BL1 to BLm and the word lines WL1 to WLn. According to another embodiment, each of the memory cell strings STR may include two or more source select transistors coupled in series to the common source structure CSL. According to this embodiment, two or more layers of source select lines may be disposed under the word lines WL1 to WLn.

At least one of the word lines WL1 to WLn may serve as a dummy word line. For example, at least one of the word line WL1 adjacent to the source select line SSL and the word line WLn adjacent to the drain select line DSL may serve as a dummy word line.

An erase operation of a semiconductor memory device may include a form period of a hot hole and an erase period.

Referring to FIGS. 1 and 2, during the form period of the hot hole of the erase operation, the row decoder 33 may control the word lines WL1 to WLn of a selected memory block to be in a floating state and the page buffer group 35 may control the bit lines BL1 to BLm of the selected memory block to be in a floating state.

The operation voltage generator 31 may apply the pre-erase voltage Vepre to generate a Gate Induced Drain Leakage (GIDL) current to the common source structure CSL during the form period of the hot hole of the erase operation. When a voltage level of the source select line SSL is low, the GIDL current may be generated between a junction of the source select transistor SST coupled to the common source structure CSL and the source select line SSL. According to an embodiment, the row decoder 33 may control the source select line SSL to have a ground voltage level during a form period of a hot hole of an erase operation.

When the GIDL current is generated, hot holes may be generated. The generated hot holes may be injected into a channel region of the memory cell string STR. Accordingly, a channel voltage of the memory cell string STR may be increased.

Subsequently, the operation voltage generator 31 may apply the erase voltage Verase greater than the pre-erase voltage Vepre to the common source structure CSL during the erase period of the erase operation. As a result, the channel voltage of the memory cell string STR may be further increased.

The row decoder 33 may control the source select line SSL to be in a floating state and the word lines WL1 to WLn to have a ground voltage level during the erase period of the erase operation. Accordingly, data stored in the memory cells MC may be erased by voltage difference between the word lines WL1 to WLn and the channel region of the memory cell string STR which has an increased potential level.

The erase operation may finish by adjusting the source select line SSL to have a ground voltage level through the row decoder 33 to turn off the source select line SSL.

The voltage applied to the common source structure CSL may be applied to the bit lines BL1 to BLm and the voltage applied to the source select line SSL may be applied to the drain select line DSL during the erase operation to improve efficiency of the above-described GIDL erase operation. According to this embodiment, the GIDL current may be generated between the drain select line DSL and the junction of the drain select transistor DST during the erase operation, such that efficiency of the erase operation may be improved.

Figure 3:
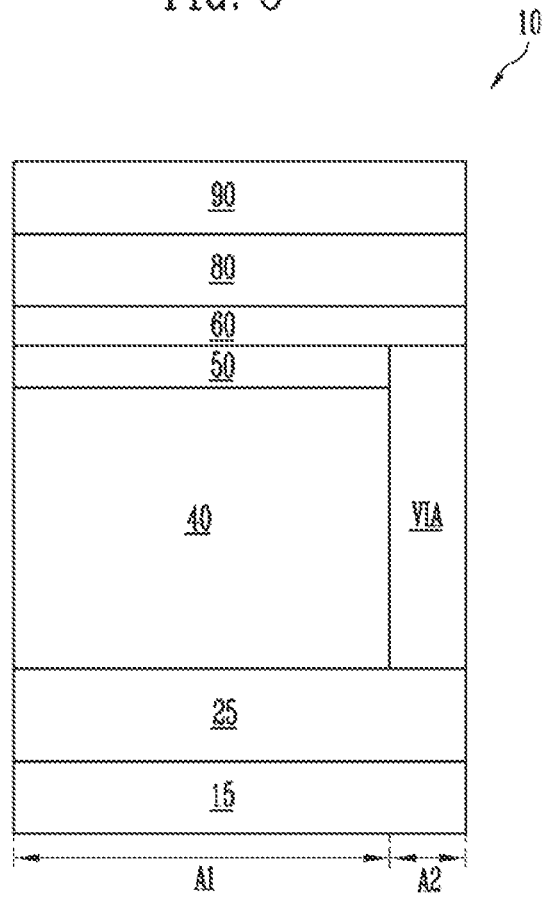
FIG. 3 is a diagram illustrating the schematic configuration of a semiconductor memory device according to an embodiment.

FIG. 3 is a diagram illustrating the schematic configuration of the semiconductor memory device 10 according to an embodiment.

Referring to FIG. 3, the semiconductor memory device 10 may include an interconnection group 25, the memory cell array 40, a first contact group 50, a first conductive group 60, a second contact group 80, and a second conductive group 90 sequentially stacked over a substrate 15 including the logic circuit LC described with reference to FIG. 1. The semiconductor memory device 10 may further include a via contact structure VIA disposed between the first conductive group 60 and the interconnection group 25.

The substrate 15 may include a first region A1 which overlaps the memory cell array 40 and a second region A2 which does not overlap the memory cell array 40. The via contact structure VIA may overlap the second region A2 of the substrate 15.

The interconnection group 25 may include a plurality of conductive lines, a plurality of conductive pads, and a plurality of contact plugs coupled to the logic circuit LC described with reference to FIG. 1.

The memory cell array 40 may include the plurality of memory cell strings STR described with reference to FIG. 2. The memory cell array 40 may overlap a part of the logic circuit LC described with reference to FIG. 1.

The via contact structure VIA may be coupled to the internal voltage generator 20 of the logic circuit LC described with reference to FIG. 1.

The first contact group 50 may include bit line contact plugs and a source contact plug. The bit line contact plugs may be coupled to the memory cell strings STR described with reference to FIG. 2. The source contact plug may form the common source structure CSL described with reference to FIG. 2.

The first conductive group 60 may include bit lines, a first upper source line, and a first upper wire. The bit lines BL1 to BLm described with reference to FIG. 2 may correspond to the bit lines of the first conductive group 60. The first upper source line may form the common source structure CSL described with reference to FIG. 2. The first upper wire may be coupled to the via contact structure VIA.

The second contact group 80 may include a contact pattern and an upper source contact portion. The contact pattern may be coupled to the first upper wire. The upper source contact portion may form the common source structure CSL described with reference to FIG. 2.

The second conductive group 90 may include a second upper wire and a second upper source line. The second upper wire may be a power line transferring the internal power voltage VCCI or the internal ground voltage VSSI described with reference to FIG. 1 to the peripheral circuit 30. The second upper source line may form the common source structure CSL described with reference to FIG. 2.

Figure 4:
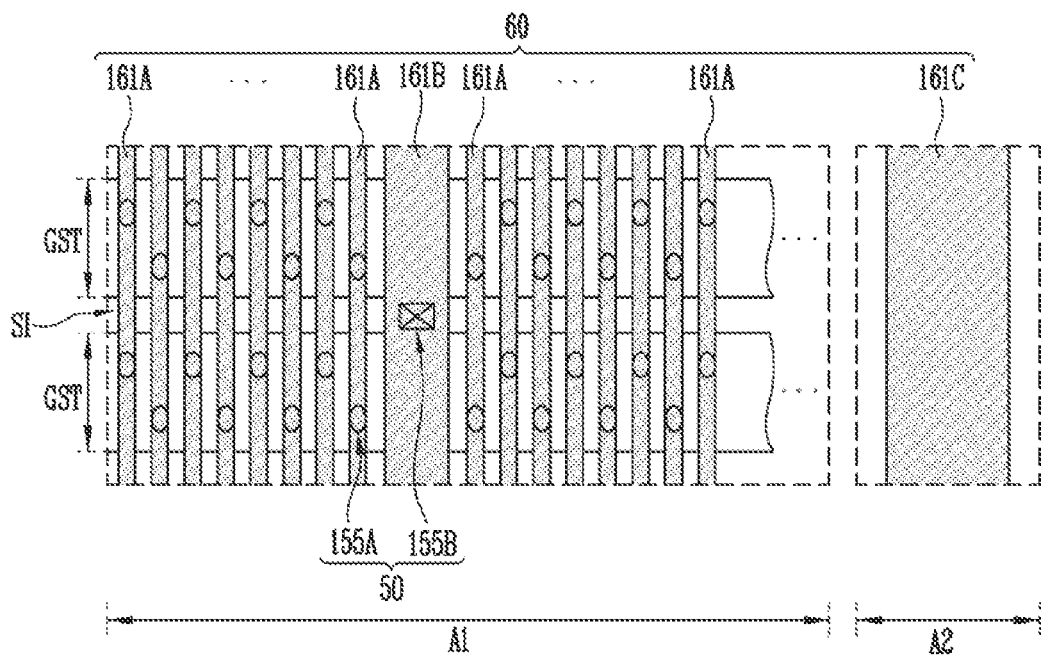
FIG. 4 is a plan view illustrating a first contact group and a first conductive group according to an embodiment.

FIG. 4 is a plan view illustrating the first contact group 50 and the first conductive group 60 according to an embodiment.

Referring to FIG. 4, the first conductive group 60 may include bit lines 161A and a first upper source line 161B overlapping the first region A1 and a first upper wire 161C overlapping the second region A2. The bit lines 161A and the first upper source line 161B may overlap a three-dimensional memory cell array. The three-dimensional memory cell array may include gate stack structures GST. The bit lines 161A and the first upper source line 161B may overlap the gate stack structures GST. The bit lines 161A, the first upper source line 161B, and the first upper wire 161C may be spaced apart from each other and may be disposed in substantially the same level. The bit lines 161A, the first upper source line 161B, and the first upper wire 161C may include the same conductive material. According to an embodiment, the bit lines 161A, the first upper source line 161B, and the first upper wire 161C may include low-resistance metal such as copper (Cu).

Each of the gate stack structures GST may extend to overlap the first region A1 and to cross the bit lines 161A. The gate stack structures GST may be separated from each other by a slit SI. The gate stack structures GST may form a single memory block or individually form different memory blocks.

Each of the gate stack structures GST may be penetrated by channel structures and the channel structures may be coupled to bit line contact plugs 155A. A lower source contact portion may be disposed in the slit SI and may be coupled to a source contact plug 155B.

Each of the bit lines 161A may be connected to the bit line contact plug 155A corresponding thereto. The first upper source line 161B may be connected to the source contact plug 155B.

Figure 5:
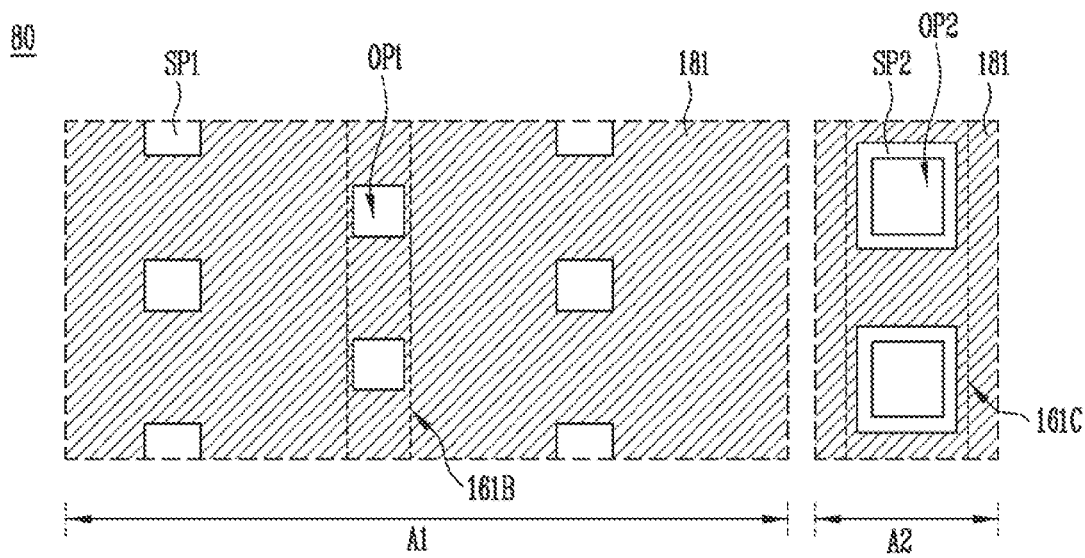

FIGS. 5 and 6 are plan views illustrating the second contact group 80 according to an embodiment.

Referring to FIGS. 5 and 6, the second contact group 80 may include a shielding pattern 181 extending to overlap the first region A1 and the second region A2, a first contact pattern 183A and second contact patterns 183B extending from the shielding pattern 181, and a third contact pattern 183C insulated from the shielding pattern 181.

The shielding pattern 181 and the first contact pattern 183A and the second contact patterns 183B coupled to the shielding pattern 181 may form an upper source contact portion.

Each of the shielding pattern 181, the first contact pattern 183A, the second contact patterns 183B, and the third contact pattern 183C may include a metal barrier layer and a metal layer formed over the metal barrier layer. For example, a metal barrier layer may include, for example but not limited to, a titanium nitride (TiN) layer and a metal layer may include tungsten (W).

FIG. 5 is a plan view illustrating the shielding pattern 181 according to an embodiment.

Referring to FIG. 5, the shielding pattern 181 may surround a plurality of first insulating pillars SP1 and a plurality of second insulating pillars SP2 and may be penetrated by a plurality of first openings OP1.

The first openings OP1 may overlap the first upper source line 161B described with reference to FIG. 4. The first insulating pillars SP1 may be disposed at opposite sides of the first upper source line 161B. According to an embodiment, the first insulating pillars SP1 may overlap the bit lines 161A described above with reference to FIG. 4. The second insulating pillars SP2 may overlap the first upper wire 161C described with reference to FIG. 4. The central regions of the second insulating pillars SP2 may be penetrated by second openings OP2 in a one-to-one manner.

FIG. 6 is a plan view illustrating the first, second, and third contact patterns 183A, 183B, and 183C according to an embodiment.

Referring to FIG. 6, the first contact pattern 183A may include first vertical portions VPa and a first line portion LPa coupling the first vertical portions VPa to each other. The first vertical portions VPa may extend from the first upper source line 161B described with reference to FIG. 4 and may fill the first openings OP1 described above with reference to FIG. 5, respectively. The first line portion LPa may overlap the first vertical portions VPa and may extend in parallel with the first upper source line 161B.

The second contact patterns 183B may be disposed at opposite sides of the first contact pattern 183A. According to an embodiment, each of the second contact patterns 183B may overlap some of the bit lines 161A described with reference to FIG. 4.

The third contact pattern 183C may include second vertical portions VPb and a second line portion LPb coupling the second vertical portions VPb to each other. The second vertical portions VPb may extend from the first upper wire 161C described with reference to FIG. 4 and may fill the second openings OP2 described above with reference to FIG. 5, respectively. The second line portion LPb may overlap the second vertical portions VPb and may extend in parallel with the first upper wire 161C. Because each of the second vertical portions VPb may be surrounded by the second insulating pillar SP2 described above with reference to FIG. 5, the second vertical portions VPb may be insulated from the shielding pattern 181 shown in FIG. 5.

FIG. 7 is a plan view illustrating the second conductive group 90 according to an embodiment.

Referring to FIG. 7, the second conductive group 90 may include a second upper source line 191A extending from the first and second contact patterns 183A and 183B described with reference to FIG. 6 and a second upper wire 191B extending from the third contact pattern 183C described with reference to FIG. 6. The second upper source line 191A and the second upper wire 191B may be spaced apart from each other and may be disposed in substantially the same level. The second upper source line 191A and the second upper wire 191B may include the same conductive material.

The second upper source line 191A may form the common source structure CSL described with reference to FIGS. 1 and 2. The source line driver 37 described with reference to FIG. 1 may be coupled to the memory cell array 40 described with reference to FIG. 1 through the second upper source line 191A.

The second upper wire 191B may be a power line transferring the internal power voltage VCCI or the internal ground voltage VSSI described with reference to FIG. 1 to the peripheral circuit 30 described with reference to FIG. 1.

The second conductive group 90 may include a conductive material having lower resistance compared to the second contact group 80 described above with reference to FIGS. 5 and 6. For example, the second conductive group 90 may include aluminum (Al). When the second conductive group 90 includes aluminum having low resistance, the internal power voltage VCCI or the internal ground voltage VSSI may be stably transferred even when the second conductive group 90 includes a power line.

According to an embodiment, even when resistance of the second upper wire 191B that serves as a power line is low, noise due to coupling capacitance between the bit lines 161A described above with reference to FIG. 4 and the second upper wire 191B may be reduced through the shielding pattern 181 described above with reference to FIG. 5. Accordingly, constraints on arrangement degree of freedom of the second upper wire 191B due to noise constraints may be reduced.

According to an embodiment, the first upper source line 161B shown in FIG. 4 and the second upper source line 191A shown in FIG. 7 may be coupled to each other through the shielding pattern 181 shown in FIG. 5, the first contact pattern 183A, and the plurality of second contact patterns 183B. Accordingly, resistance of an interconnection structure of the first upper source line 161B and the second upper source line 191A may be reduced, and thus source line bouncing may be reduced.

As described above, because the noise and the source line bouncing are reduced, the operating characteristics of the semiconductor memory device may be improved.

Figure 8A:
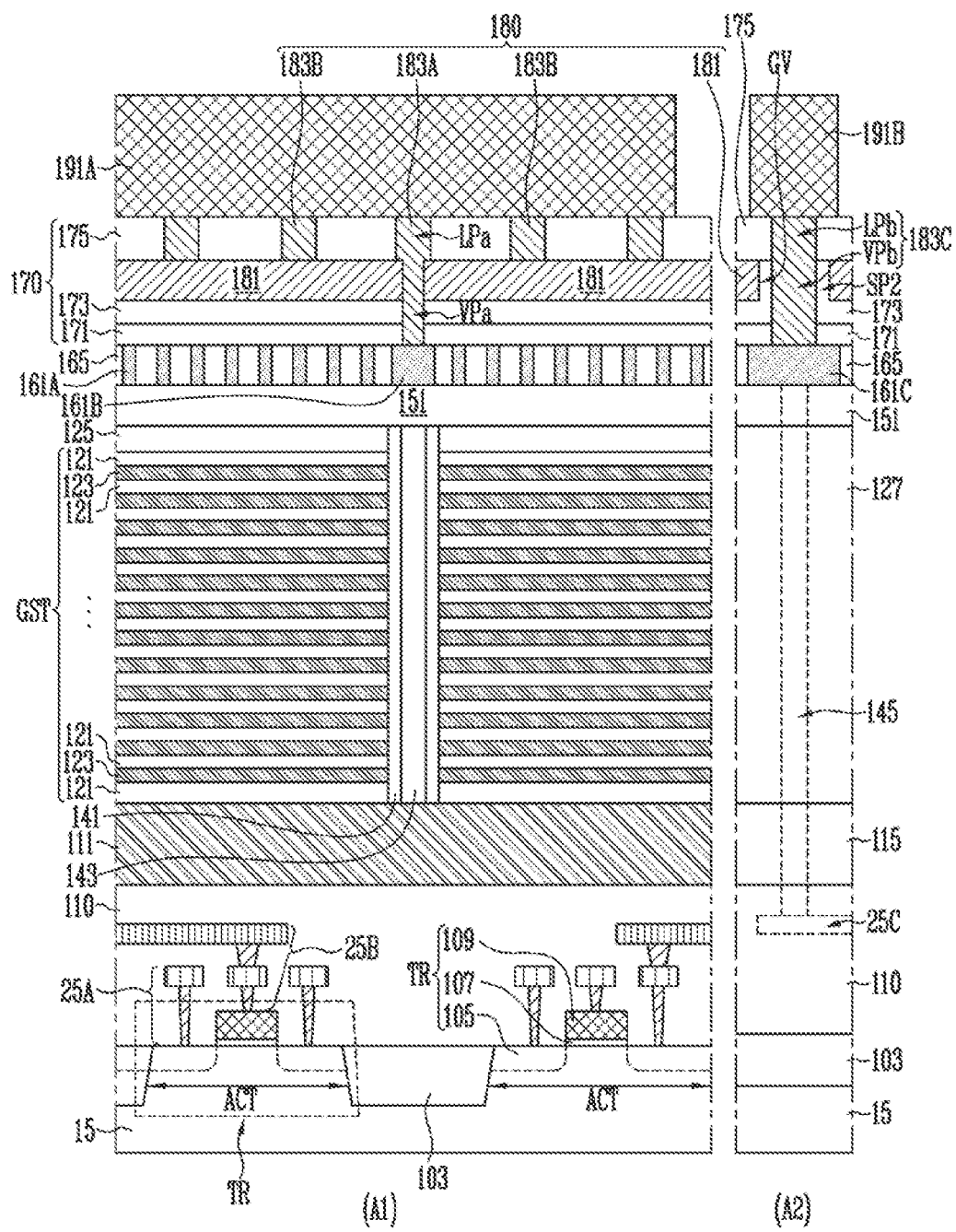
FIGS. 8A and 8B are cross-sectional diagrams of a semiconductor memory device taken along lines I-I' and II-II' shown in FIG. 7.
Figure 8B:
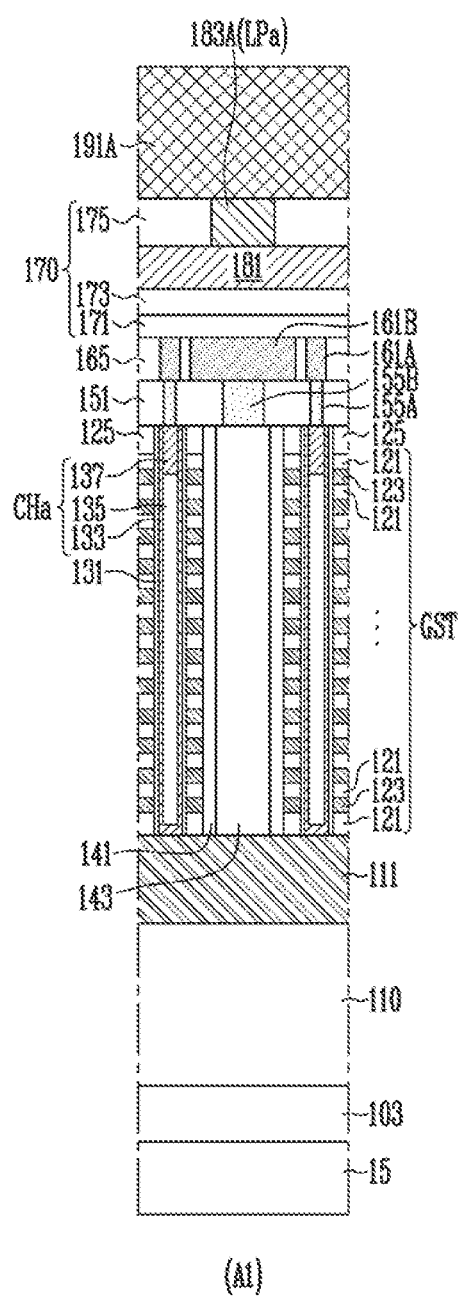

FIGS. 8A and 8B are cross-sectional diagrams of a semiconductor memory device taken along lines I-I' and II-II' shown in FIG. 7.

Referring to FIGS. 8A and 8B, the substrate 15 may include the first region A1 and the second region A2. The first region A1 may be a region which overlaps the gate stack structures GST and the second region A2 may be a region which laterally protrudes further than the gate stack structures GST. The substrate 15 may include the logic circuit LC described with reference to FIG. 1.

The logic circuit of the substrate 15 may be formed over a bulk silicon substrate, a silicon-on-insulator substrate, a germanium substrate, a germanium-on-insulator substrate, a silicon-germanium substrate, or an epitaxial layer formed by a selective epitaxial growth method. According to an embodiment, the logic circuit LC may include a plurality of transistors TR. The transistors TR may be disposed over active regions ACT defined by isolation layers 103. Each of the transistors TR may include a gate insulating layer 107 and a gate electrode 109 stacked over the active region ACT corresponding thereto and may also include junctions 105 formed in opposite sides of the gate electrode 109 in the active region ACT. One of the junctions 105 may serve as a source region and the other of the junctions 105 may serve as a drain region. A structure of the transistors TR and the isolation layers 103 is not limited to the embodiment illustrated in FIG. 8A but may be variously changed according to a design rule of a semiconductor memory device. The logic circuit LC may include various elements other than the transistors TR illustrated in FIG. 8A.

The logic circuit of the substrate 15 may be coupled to the interconnection group 25 described with reference to FIG. 3. For example, the interconnection group 25 may include first connection structures 25A, second connection structures 25B, and a third connection structure 25C. The first connection structures 25A may be coupled to the junctions 105 of the transistors TR, respectively. Each of the second connection structures 25B may be coupled to the gate electrode 109 of the transistors TR corresponding thereto. Each of the first and second connection structures 25A and 25B may include conductive patterns stacked over the substrate 15, coupled to each other, and having various forms. The third connection structure 25C may be a pattern coupled to an output pad outputting the internal ground voltage VSSI or the internal power voltage VCCI. The third connection structure 25C may overlap the second region A2 of the substrate 15 and might not overlap line I-I' shown in FIG. 7.

The interconnection group including the first, second, and third connection structures 25A, 25B, and 25C and the substrate 15 may be covered by a first lower insulating layer 110. The first lower insulating layer 110 may include two or more insulating layers.

The gate stack structures GST may be disposed on a lower source line 111 overlapping the first lower insulating layer 110. The lower source line 111 may overlap the first region A1. The lower source line 111 may form the common source structure CSL described with reference to FIGS. 1 and 2. The lower source line 111 may include a doped semiconductor layer including at least one of an n-type dopant and a p-type dopant. For example, the lower source line 111 may include an n-type doped silicon layer.

A second lower insulating layer 115 may be disposed in the same level as the lower source line 111. The second lower insulating layer 115 may overlap the second region A2.

Each of the gate stack structures GST may be penetrated by channel structures CHa (see FIG. 8B). Each of the gate stack structures GST may surround the channel structures CHa corresponding thereto, and include interlayer insulating layers 121 and conductive patterns 123 alternately stacked over the lower source line 111.

The conductive patterns 123 may serve as the source select line SSL, the word lines WL1 to WLn, and the drain select line DSL described with reference to FIG. 2. According to an embodiment, the conductive patterns 123 may include a lower conductive pattern that is disposed adjacent to the lower source line 111 and serves as the source select line SSL described with reference to FIG. 2, an upper conductive pattern that is disposed adjacent to the bit lines 161A and serves as the drain select line DSL described with reference to FIG. 2, and intermediate conductive patterns that are disposed between the upper conductive pattern and the lower conductive pattern and serve as the word lines WL1 to WLn described with reference to FIG. 2.

Referring to FIG. 8B, each of the channel structures CHa may extend from the lower source line 111. Each of the channel structures CHa may include a channel layer 133. According to an embodiment, the channel layer 133 may be a hollow type and may be in contact with the upper surface of the lower source line 111. The central region of the channel structure CHa which is defined by the hollow-type channel layer 133 may be filled with a core insulating layer 135 and a doped semiconductor layer 137. The doped semiconductor layer 137 may be disposed on the core insulating layer 135. The channel structures CHa are not limited to the embodiment illustrated in FIG. 8B. According to another embodiment, the core insulating layer 135 may be omitted and the channel layer 133 of each of the channel structures CHa may extend to fill the central region of the channel structure CHa corresponding thereto.

The channel layer 133 may serve as a channel region of a memory cell string corresponding thereto. The channel layer 133 may include a semiconductor material. According to an embodiment, the channel layer 133 may include silicon.

An end of each of the channel structures CHa facing the bit lines 161A may include an end of the channel layer 133 and the doped semiconductor layer 137 surrounded by the end of the channel layer 133. At least one of an n-type dopant and a p-type dopant may be distributed to the end of each of the channel structures CHa. According to an embodiment, an n-type dopant may be distributed to an end of each of the channel structures CHa.

A memory layer 131 may be disposed between each of the channel structures CHa and the gate stack structure GST corresponding thereto. The memory layer 131 may extend along a sidewall of each of the channel structures CHa. The memory layer 131 may surround a sidewall of the channel structure CHa corresponding thereto. The memory layer 131 may include a tunnel insulating layer, a data storage layer, and a blocking insulating layer sequentially stacked from the sidewall of the channel structure CHa corresponding thereto towards the gate stack structure GST. The tunnel insulating layer may include silicon oxide allowing charge tunneling. The data storage layer may include a charge trap layer. For example, the charge trap layer may include silicon nitride. The blocking insulating layer may include an oxide capable of blocking charges. The data storage layer may include various materials other than the charge trap layer and may be changed in various forms between the tunnel insulating layer and the blocking insulating layer according to a structure of a memory cell to be embodied. For example, the data storage layer may include a phase-change material layer or a material layer for a floating gate.

According to the structure as described above, the memory cells MC described with reference to FIG. 2 may be defined in intersections of the intermediate conductive patterns that serve as the word lines among the conductive patterns 123 and the channel structure CHa. The source select transistor SST described above with reference to FIG. 2 may be defined in an intersection of the lower conductive pattern that serves as the source select line among the conductive patterns 123 and the channel structure CHa. The drain select transistor DST described with reference to FIG. 2 may be defined in an intersection of the upper conductive pattern that serves as the drain select line among the conductive patterns 123 and the channel structure CHa. The source select transistor SST, the memory cells MC, and the drain select transistor DST described with reference to FIG. 2 may be coupled in series by the channel structure CHa to form the memory cell string STR described with reference to FIG. 2.

Referring to FIGS. 8A and 8B, the gate stack structures GST that neighbor each other may be separated from each other by the slit SI shown in FIG. 4. The slit SI may be filled with sidewall insulating layers 141 and a lower source contact portion 143. The sidewall insulating layers 141 may be formed on the sidewalls of the slit SI. The lower source contact portion 143 may fill the central region of the slit SI and may be insulated from the gate stack structures GST by the sidewall insulating layer 141. The lower source contact portion 143 may include various conductive materials and may extend in parallel with the channel structures CHa from the lower source line 111.

A gap-fill insulating layer 127 may be disposed in the same level as the gate stack structures GST. The gap-fill insulating layer 127 may be disposed on the second lower insulating layer 115 and may overlap the second region A2.

The gate stack structures GST may be covered by a first upper insulating layer 125. The first upper insulating layer 125 may be penetrated by the channel structures CHa, the memory layer 131, the sidewall insulating layers 141, and the lower source contact portion 143. The first upper insulating layer 125 and the gap-fill insulating layer 127 may be covered by a second upper insulating layer 151.

The second upper insulating layer 151 may extend to overlap the first region A1 and the second region A2. The second upper insulating layer 151 may be penetrated by a first contact group including the bit line contact plugs 155A and the source contact plug 155B.

The bit line contact plugs 155A may extend to be in contact with the channel structures CHa, respectively, and to pass through the second upper insulating layer 151. The channel structures CHa may be coupled to the bit lines 161A via the bit line contact plugs 155A. Each of the bit line contact plugs 155A may extend from the doped semiconductor layer 137 corresponding thereto to the bit line 161A corresponding thereto.

The source contact plug 155B may extend to be in contact with the lower source contact portion 143 and to pass through the second upper insulating layer 151. The lower source contact portion 143 may be coupled to the first upper source line 161B via the source contact plug 155B. The source contact plug 155B may extend from the lower source contact portion 143 towards the first upper source line 161B.

The second lower insulating layer 115, the gap-fill insulating layer 127, and the second upper insulating layer 151 overlapping the second region A2 may be penetrated by a vertical contact plug 145. The vertical contact plug 145 may form the via contact structure VIA described with reference to FIG. 3. The vertical contact plug 145 may include various conductive materials and extend from the third connection structure 25C towards the first upper wire 161C. The vertical contact plug 145 may overlap the second region A2 of the substrate 15 and might not overlap line I-I' shown in FIG. 7. In other words, in a planar viewpoint, the position of the vertical contact plug 145 may be misaligned with line I-I'.

The first conductive group including the bit lines 161A, the first upper source line 161B, and the first upper wire 161C may pass through a third upper insulating layer 165 disposed on the second upper insulating layer 151. Each of the bit lines 161A may extend to pass through the third upper insulating layer 165 and to overlap the gate stack structure GST and the bit line contact plug 155A corresponding thereto. The first upper source line 161B may overlap the lower source contact portion 143 and the source contact plug 155B. The first upper wire 161C may be coupled to the internal voltage generator 20 of the logic circuit LC described with reference to FIG. 1 through the vertical contact plug 145 and the third connection structure 25C.

The bit lines 161A, the first upper source line 161B, and the first upper wire 161C may be covered by an insulating structure 170 and the shielding pattern 181 and the first, second, and third contact patterns 183A, 183B, and 183C may be embedded in the insulating structure 170.

The insulating structure 170 may include a protective layer 171 that may serve as a diffusion barrier or an etching barrier, a first insulating layer 173 and a second insulating layer 175 stacked over the protective layer 171. The protective layer 171 may include nitrogen doped silicon carbide (NDC). For example, the protective layer 171 may include a silicon carbonitride (SiCN) layer. Each of the first insulating layer 173 and the second insulating layer 175 may include an oxide layer.

The first contact pattern 183A may extend from the first upper source line 161B towards the second upper source line 191A. The first contact pattern 183A may include the first vertical portion VPa and the first line portion LPa extending from the first vertical portion VPa to pass through the second insulating layer 175. The first vertical portion VPa may extend from the first upper source line 161B to fill the first opening OP1 of the shielding pattern 181 described with reference to FIG. 5. The first vertical portion VPa may pass through the protective layer 171 and the first insulating layer 173 of the insulating structure 170. The first line portion LPa may have an edge overlapping the shielding pattern 181. In an embodiment, the shielding pattern 181 may extend from a sidewall of the first contact pattern 183A to overlap the plurality of bit lines 161A.

The shielding pattern 181 may fill a groove GV formed in the first insulating layer 173. The protective layer 171 and the first insulating layer 173 of the insulating structure 170 may extend between the first conductive group (161A, 161B, and 161C) and the shielding pattern 181. The shielding pattern 181 may be covered by the second insulating layer 175. The shielding pattern 181 may extend from the sidewall of the first vertical portion VPa to overlap the bit lines 161A and the second region A2. The shielding pattern 181 may be in contact with and surround the sidewall of the first vertical portion VPa.

The second contact patterns 183B may pass through the second insulating layer 175 of the insulating structure 170. The second contact patterns 183B may extend from the shielding pattern 181 towards the second upper source line 191A.

The shielding pattern 181 and the first and second contact patterns 183A and 183B coupled to the shielding pattern 181 may form an upper source contact portion 180.

The third contact pattern 183C may include the second vertical portion VPb and the second line portion LPb extending from the second vertical portion VPb. The second vertical portion VPb may be surrounded by the second insulating pillar SP2 as described with reference to FIGS. 5 and 6. The second insulating pillar SP2 may be defined as a part of the first insulating layer 173 formed on the sidewall of the shielding pattern 181. The second vertical portion VPb may extend from the first upper wire 161C to pass through the protective layer 171 and the first insulating layer 173 of the insulating structure 170. The second line portion LPb may extend from the second vertical portion VPb towards the second upper wire 191B to be in contact with the second upper wire 191B. The second line portion LPb may pass through the second insulating layer 175.

The second conductive group including the second upper source line 191A and the second upper wire 191B may be disposed on the insulating structure 170. The second upper source line 191A may extend to overlap the bit lines 161A and the first upper source line 161B. The second upper source line 191A may be connected to the first upper source line 161B via the upper source contact portion 180 and the first upper source line 161B may be connected to the lower source line 111 via the source contact plug 155B and the lower source contact portion 143.

The lower source line 111, the lower source contact portion 143, the source contact plug 155B, the first upper source line 161B, the upper source contact portion 180, and the second upper source line 191A may form the common source structure CSL described with reference to FIGS. 1 and 2.

According to an embodiment, the increased capacitance may be provided between the bit lines 161A and the shielding pattern 181. Accordingly, the shielding pattern 181 transferring an erase voltage may transfer a high voltage to the bit lines 161A overlapping the shielding pattern 181 by capacitive coupling during an erase operation. Accordingly, the efficiency of the erase operation may be improved even when high-voltage transistors for applying a high voltage such as an erase voltage to the bit lines 161A are not separately provided to the page buffer group 35 shown in FIG. 1.

In addition, the shielding pattern 181 may reduce noise between the second upper wire 191B and the bit lines 161A.

Figure 9A:
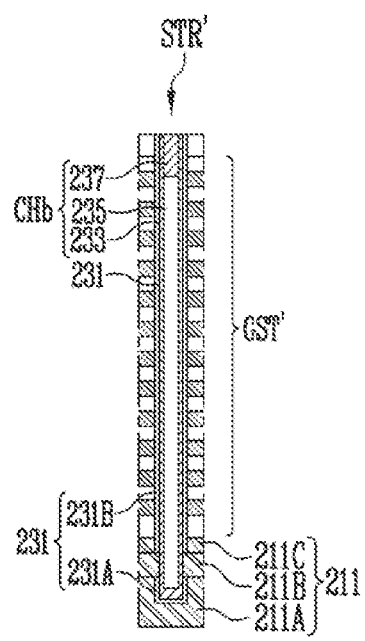
FIGS. 9A and 9B are cross-sectional diagrams illustrating memory cell strings according to various embodiments.
Figure 9B:
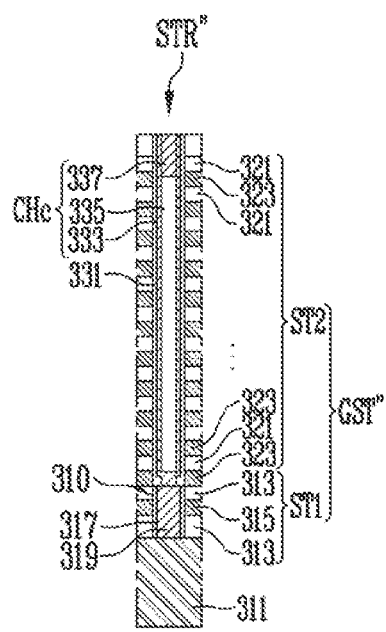

FIGS. 9A and 9B are cross-sectional diagrams illustrating memory cell strings according to various embodiments.

Referring to FIG. 9A, a memory cell string STR' may be defined along a channel structure CHb passing through a gate stack structure GST'. The gate stack structure GST' may have the same structure as the embodiment described with reference to FIGS. 8A and 8B.

The memory cell string STR' may be coupled to a lower source line 211 disposed under the gate stack structure GST'. The lower source line 211 may have a structure in which two or more semiconductor layers are stacked. According to an embodiment, the lower source line 211 may include a first semiconductor layer 211A, a second semiconductor layer 211B, and a third semiconductor layer 211C. Each of the first, second, and third semiconductor layers 211A, 211B, and 211C may include silicon. Each of the first, second, and third semiconductor layers 211A, 211B, and 211C may include a doped semiconductor layer including at least one of an n-type dopant and a p-type dopant. The second semiconductor layer 211B may be disposed on the first semiconductor layer 211A and the third semiconductor layer 211C may be disposed on the second semiconductor layer 211B. According to another embodiment which is not illustrated in FIG. 9A, the third semiconductor layer 211C may be omitted.

As described above with reference to FIGS. 8A and 8B, the channel structure CHb may include a channel layer 233, a core insulating layer 235, and a doped semiconductor layer 237. The channel structure CHb may extend into the lower source line 211. According to an embodiment, the channel structure CHb may pass through the third semiconductor layer 211C and the second semiconductor layer 211B and may extend into the first semiconductor layer 211A.

A memory layer 231 may be divided into a first memory pattern 231A and a second memory pattern 231B by the second semiconductor layer 211B. The first memory pattern 231A may be disposed between the first semiconductor layer 211A and a first part of the channel structure CHb that extends into the first semiconductor layer 211A. The second memory pattern 231B may extend along a sidewall of a second part of the channel structure CHb that passes through the gate stack structure GST' and the third semiconductor layer 211C.

A third part of the channel structure CHb that is disposed between the first part and the second part may be surrounded by the second semiconductor layer 211B. The second semiconductor layer 211B may extend between the first and second memory patterns 231A and 231B and may be in direct contact with the third part of the channel structure CHb.

Referring to FIG. 9B, a memory cell string STR" may be defined along a channel structure CHc and a lower channel structure 319. The channel structure CHc and the lower channel structure 319 may pass through a gate stack structure GST".

The gate stack structure GST" may include a first stack structure ST1 and a second stack structure ST2 disposed on the first stack structure ST1. The first stack structure ST1 may include a lower conductive pattern 315 and first interlayer insulating layers 313. The lower conductive pattern 315 may serve as a source select line and may be disposed between the first interlayer insulating layers 313. The second stack structure ST2 may include conductive patterns 323 and second interlayer insulating layers 321 alternately stacked on each other. The conductive patterns 323 may serve as word lines and a drain select line. The lower channel structure 319 may pass through the first stack structure ST1 and the channel structure CHc may pass through the second stack structure ST2.

The memory cell string STR" may be coupled to a lower source line 311 disposed under the first stack structure ST1. The lower source line 311 may include a doped semiconductor layer including at least one of an n-type dopant and a p-type dopant.

The lower channel structure 319 may include a doped semiconductor layer. For example, the lower channel structure 319 may include n-type doped silicon. The lower channel structure 319 may fill a lower hole 310 passing through the first stack structure ST1. A sidewall of the lower channel structure 319 may be surrounded by a gate insulating layer 317. The lower channel structure 319 may be in contact with the lower source line 311.

As described with reference to FIGS. 8A and 8B, the channel structure CHc may include a channel layer 333, a core insulating layer 335, and a doped semiconductor layer 337. The channel layer 333 of the channel structure CHc may be in contact with the lower channel structure 319.

A memory layer 331 may be disposed between the second stack structure ST2 and the channel structure CHc and may surround the sidewall of the channel structure CHc.

FIGS. 8A, 8B, 9A, and 9B illustrate the memory cell strings forming a three-dimensional memory cell array as examples. However, the present disclosure is not limited thereto. According to another embodiment, the memory cell array 40 described with reference to FIGS. 1 and 3 may include a two-dimensional memory cell array.

Hereinafter, methods of manufacturing a semiconductor memory device according to an embodiment will be schematically described. Processes to be described below may be carried out after a three-dimensional memory cell array or a two-dimensional memory cell array is formed over a substrate including a logic circuit.

Figure 10A:
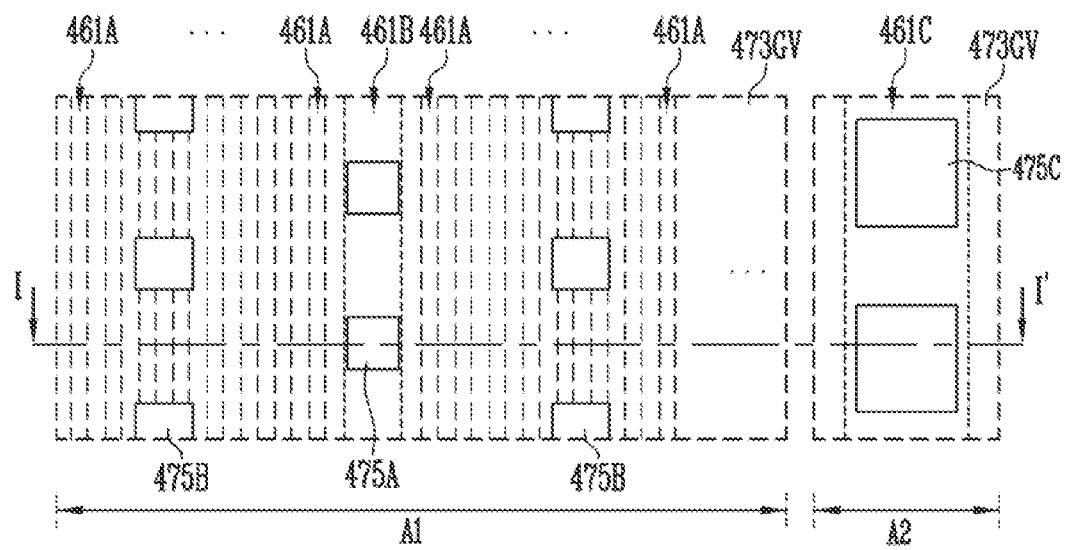
FIGS. 10A, 10B, and 11 are diagrams illustrating an embodiment of a process of forming a shielding pattern that overlaps a first conductive group.
Figure 10B:
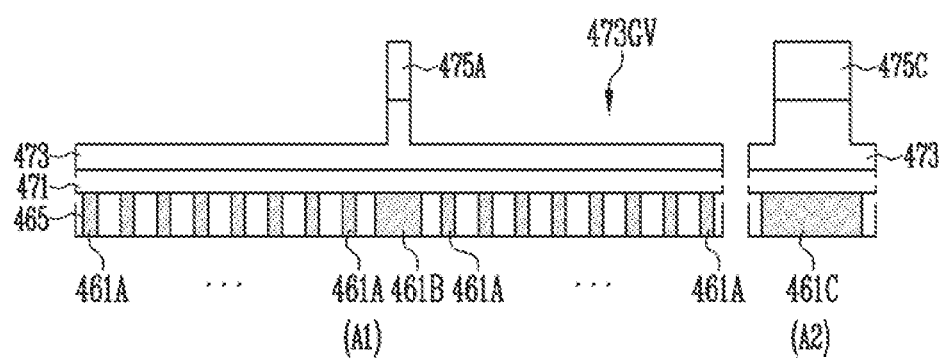
Figure 11:
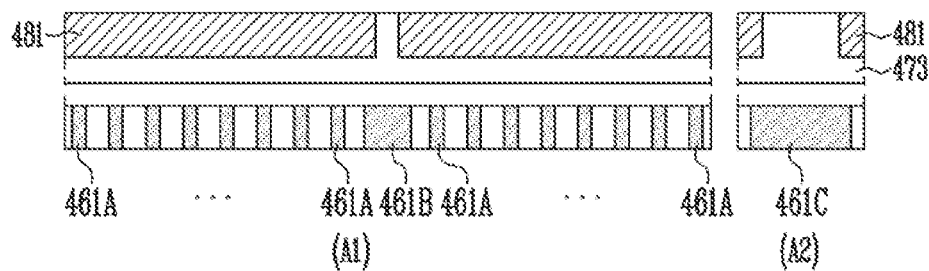

FIGS. 10A, 10B, and 11 are diagrams illustrating an embodiment of a process of forming a shielding pattern 481 overlapping a first conductive group (461A, 461B, and 461C).

The first conductive group (461A, 461B, and 461C) may include bit lines 461A, a first upper source line 461B, and a first upper wire 461C passing through an upper insulating layer 465 that extends to cover a memory cell array. The bit lines 461A and the first upper source line 461B may be coupled to memory cell strings forming a memory cell array. A memory cell string according to an embodiment may be formed by the channel structure CHa coupled to the lower source line 111 and the gate stack structure GST surrounding the channel structure CHa described above with reference to FIGS. 8A and 8B. A memory cell string according to another embodiment may be formed as the memory cell string (STR' or STR") described above with reference to FIG. 9A or 9B.

The bit lines 461A and the first upper source line 461B may overlap the first region A1 of a substrate including a logic circuit and the first upper wire 461C may overlap the second region A2 of the substrate including the logic circuit. The first region A1 may be a region which overlaps a memory cell array and the second region A2 may be a region which does not overlap the memory cell array. The logic circuit may include the transistors TR shown in FIG. 8A and may be connected to the connection structures 25A, 25B, and 25C of the interconnection group as illustrated in FIG. 8A. As described with reference to FIG. 8A, the connection structure 25C formed in the second region A2 may be electrically coupled to the first upper wire 461C.

The first conductive group (461A, 461B, and 461C) described above may include copper (Cu). The first conductive group (461A, 461B, and 461C) may be covered by a protective layer 471. The protective layer 471 may prevent copper from diffusing and may include a material that may serve as an etch stop layer. According to an embodiment, the protective layer 471 may include nitrogen doped silicon carbide (NDC) described with reference to FIGS. 8A and 8B. A conductive material forming the first conductive group (461A, 461B, and 461C) may include various metals and the protective layer 471 may be omitted.

The shielding pattern 481 may be formed after the first conductive group (461A, 461B, and 461C) is formed or the protective layer 471 is formed. The shielding pattern 481 may be formed using a Damascene process. For example, a process of forming the shielding pattern 481 may include forming a first insulating layer 473 including a groove 473GV that overlaps the first conductive group (461A, 461B, and 461C) and filling the groove 473GV with a conductive material.

FIG. 10A and FIG. 10B are a plan view and a cross-sectional view, respectively, illustrating forming the first insulating layer 473 including the groove 473GV. FIG. 10B is a cross-sectional view taken along line I-I' shown in FIG. 10A.

Referring to FIGS. 10A and 10B, forming the first insulating layer 473 including the groove 473GV may include forming an oxide layer that covers the first conductive group (461A, 461B, and 461C), forming mask patterns 475A, 475B, and 475C over the oxide layer, and etching the oxide layer by an etching process using the mask patterns 475A, 475B, and 475C as an etching barrier.

The mask patterns 475A, 475B, and 475C may be spaced apart from each other. The mask patterns 475A, 475B, and 475C may include the first mask patterns 475A overlapping the first upper source line 461B, the second mask patterns 475B overlapping some of the bit lines 461A, and the third mask patterns 475C overlapping the first upper wire 461C. The groove 473GV may extend to overlap the first region A1 and the second region A2.

FIG. 11 is a cross-sectional diagram illustrating filling the groove 473GV shown in FIG. 10B with a conductive material.

Referring to FIG. 11, the conductive material may include a metal barrier layer formed along the surface of the groove 473GV and a metal layer formed on the metal barrier layer. For example, a metal barrier layer may include a titanium nitride (TiN) layer and a metal layer may include tungsten (W). The conductive material may be planarized by a planarization process such as a Chemical Mechanical Polishing (CMP) method and mask patterns may be removed by the planarization process and a cleaning process.

The shielding pattern 481 may be formed in the groove 473GV shown in FIG. 10B by the process described above. The shielding pattern 481 may extend to overlap the first region A1 and the second region A2.

Figure 12A:
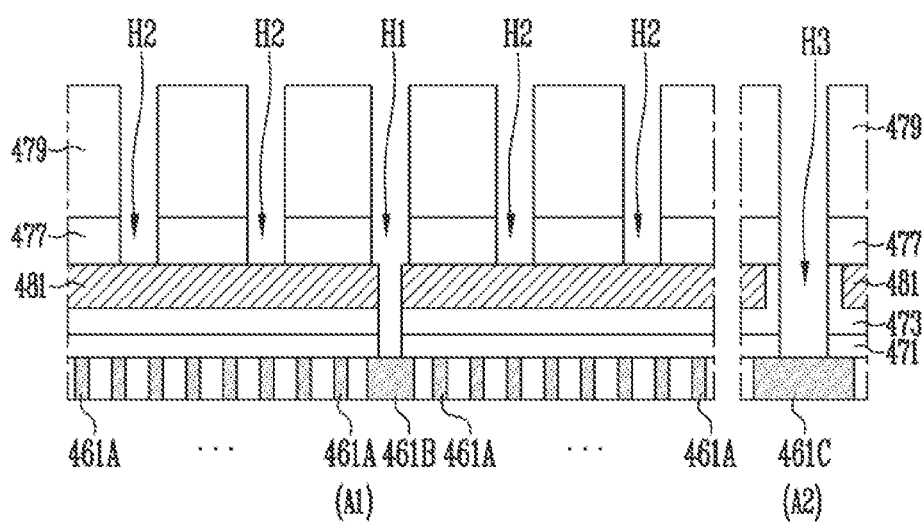
FIGS. 12A and 12B are cross-sectional diagrams illustrating an embodiment of a process of forming first to third contact patterns.
Figure 12B:
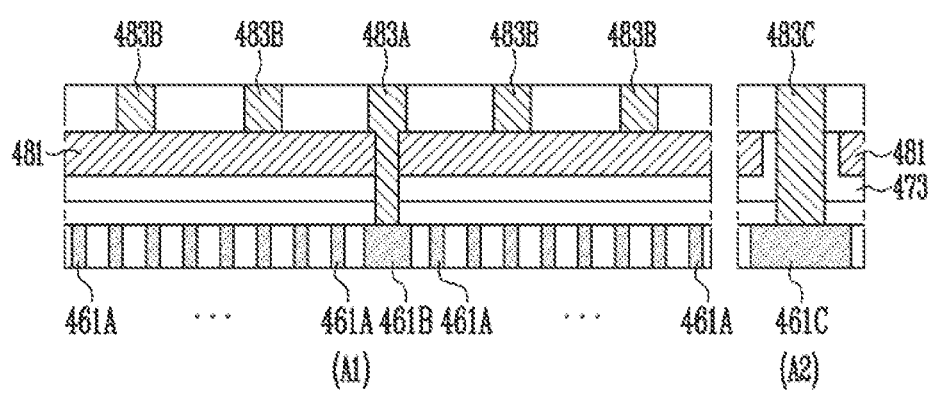

FIGS. 12A and 12B are cross-sectional diagrams illustrating an embodiment of a process of forming first, second, and third contact patterns 483A, 483B, and 483C.

Referring to FIGS. 12A and 12B, the process of forming the first, second, and third contact patterns 483A, 483B, and 483C may include forming a second insulating layer 477, forming first, second, and third holes H1, H2, and H3, and filling the first, second, and third holes H1, H2, and H3 with a conductive material.

FIG. 12A is a cross-sectional diagram illustrating forming the second insulating layer 477 and forming the first, second, and third holes H1, H2, and H3.

Referring to FIG. 12A, the second insulating layer 477 may be formed on the shielding pattern 481 to cover the first insulating layer 473. The second insulating layer 477 may include an oxide layer. For example, the second insulating layer 477 may be silicon oxide using tetraethyl orthosilicate (TEOS).

Forming the first, second, and third holes H1, H2, and H3 may include forming a mask pattern 479 that includes a plurality of openings on the second insulating layer 477, and etching at least one of the protective layer 471, the first insulating layer 473, and the second insulating layer 477 by an etching process using the mask pattern 479 as an etching barrier. The first hole H1 may expose the first upper source line 461B and the shielding pattern 481, the second holes H2 may expose the shielding pattern 481, and the third hole H3 may expose the first upper wire 461C.

The first hole H1 may pass through the second insulating layer 477, the first insulating layer 473, and the protective layer 471 overlapping the first upper source line 461B. The second holes H2 may pass through the second insulating layer 477 overlapping the shielding pattern 481. The third hole H3 may pass through the second insulating layer 477, the first insulating layer 473, and the protective layer 471 overlapping the first upper wire 461C.

FIG. 12B is a cross-sectional diagram illustrating filling the first, second, and third holes H1, H2, and H3 shown in FIG. 12A with a conductive material.

Referring to FIG. 12B, the conductive material may include a metal barrier layer formed along the surface of each of the first, second, and third holes H1, H2, and H3, and a metal layer formed on the metal barrier layer. For example, a metal barrier layer may include a titanium nitride (TiN) layer and a metal layer may include tungsten (W). The conductive material may be planarized by a planarization process such as a CMP method, and the mask patterns may be removed by the planarization process and a cleaning process.

The first, second, and third contact patterns 483A, 483B, and 483C which fill the first, second, and third holes H1, H2, and H3 shown in FIG. 12A, respectively, may be formed by the process described above. The first contact pattern 483A may fill the first hole H1 and may be in contact with the first upper source line 461B and the shielding pattern 481. The second contact pattern 483B may fill the second holes H2, respectively, and may be in contact with the shielding pattern 481. The third contact pattern 483C may fill the third hole H3 and may be in contact with the first upper wire 461C. The third contact pattern 483C may be insulated from the shielding pattern 481 by the first insulating layer 473.

Figure 13A:
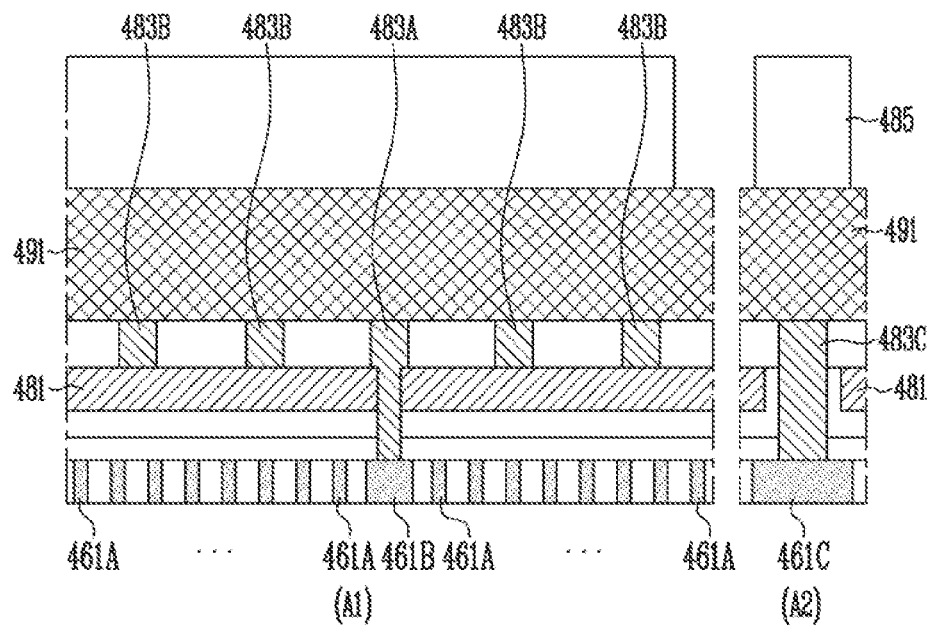
FIGS. 13A and 13B are cross-sectional diagrams illustrating an embodiment of a process of forming a second conductive group.
Figure 13B:
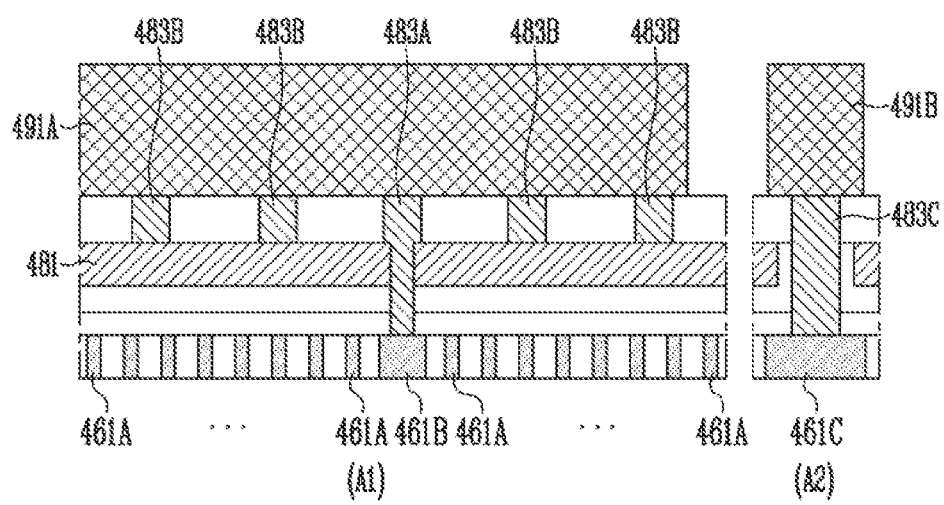

FIGS. 13A and 13B are cross-sectional diagrams illustrating an embodiment of a process of forming a second conductive group (491A, 491B).

Referring to FIGS. 13A and 13B, forming the second conductive group (491A, 491B) may include forming a conductive layer 491 and forming a second upper source line 491A and a second upper wire 491B by etching the conductive layer 491.

Referring to FIG. 13A, the conductive layer 491 may extend to cover the first, second, and third contact patterns 483A, 483B, and 483C. The conductive layer 491 may have a structure in which a first metal barrier layer, a metal layer, and a second metal barrier layer are stacked. For example, each of the first and second metal barrier layers may include a titanium nitride (TiN) layer and a metal layer may include aluminum (Al) having lower resistance than tungsten (W).

Mask patterns 485 may be disposed on the conductive layer 491.

Referring to FIG. 13B, the second upper source line 491A and the second upper wire 491B separated from each other may be formed by an etching process of the conductive layer 491 using the mask patterns 485 shown in FIG. 13A as etching barriers. The mask patterns 485 may be removed after the second upper source line 491A and the second upper wire 491B are formed.

The second upper source line 491A may overlap the bit lines 461A and may be electrically coupled to the first upper source line 461B through the shielding pattern 481, the first contact pattern 483A, and the second contact patterns 483B. The second upper wire 491B may be electrically coupled to the first upper wire 461C through the third contact pattern 483C.

Figure 14:
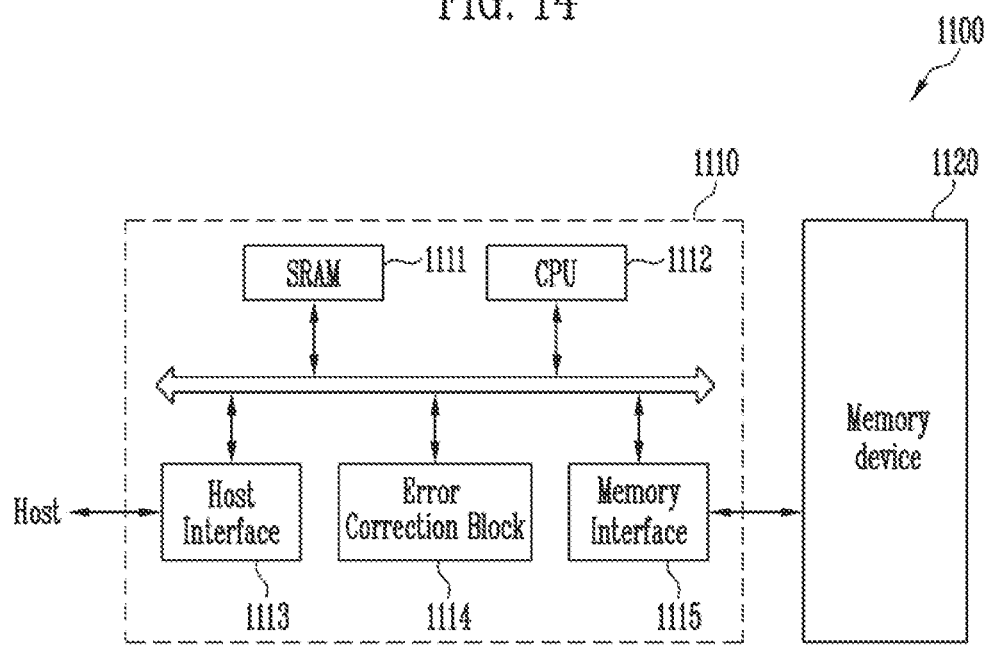
FIG. 14 is a block diagram illustrating the configuration of a memory system according to an embodiment.

FIG. 14 is a block diagram illustrating the configuration of a memory system 1100 according to an embodiment.

Referring to FIG. 14, the memory system 1100 may include a memory device 1120 and a memory controller 1110.

The memory device 1120 may be a multi-chip package including a plurality of flash memory chips. The memory device 1120 may include bit lines and a first upper source line coupled to a memory cell array, and a first upper wire spaced apart from the bit lines and the first upper source line. In addition, the memory device 1120 may include a second upper source line overlapping and coupled to the first upper source line and a shielding pattern shielding the second upper source line from the bit lines. The shielding pattern may form an upper source contact portion that couples the second upper source line overlapping the first upper source line and the first upper source line to each other.

The memory controller 1110 may be configured to control the memory device 1120 and may include Static Random Access Memory (SRAM) 1111, a Central Processing Unit (CPU) 1112, a host interface 1113, an error correction block 1114, and a memory interface 1115. The SRAM 1111 may serve as operational memory of the CPU 1112, the CPU 1112 may perform general control operations for data exchange of the memory controller 1110, and the host interface 1113 may include a data exchange protocol of a host accessing the memory system 1100. The error correction block 1114 may detect and correct error included in data read from the memory device 1120. The memory interface 1115 may interface with the memory device 1120. The memory controller 1110 may further include Read Only Memory (ROM) for storing code data for interfacing with the host.

The memory system 1100 having the above-described configuration may be a memory card or a Solid State Drive (SSD) in which the memory device 1120 and the memory controller 1110 are combined. For example, when the memory system 1100 is an SSD, the memory controller 1110 may communicate with an external device (e.g., a host) through one of various interface protocols including a Universal Serial Bus (USB), a MultiMedia Card (MMC), Peripheral Component Interconnection-Express (PCI-E), Serial Advanced Technology Attachment (SATA), Parallel Advanced Technology Attachment (PATA), a Small Computer System Interface (SCSI), an Enhanced Small Disk Interface (ESDI), and Integrated Drive Electronics (IDE).

Figure 15:
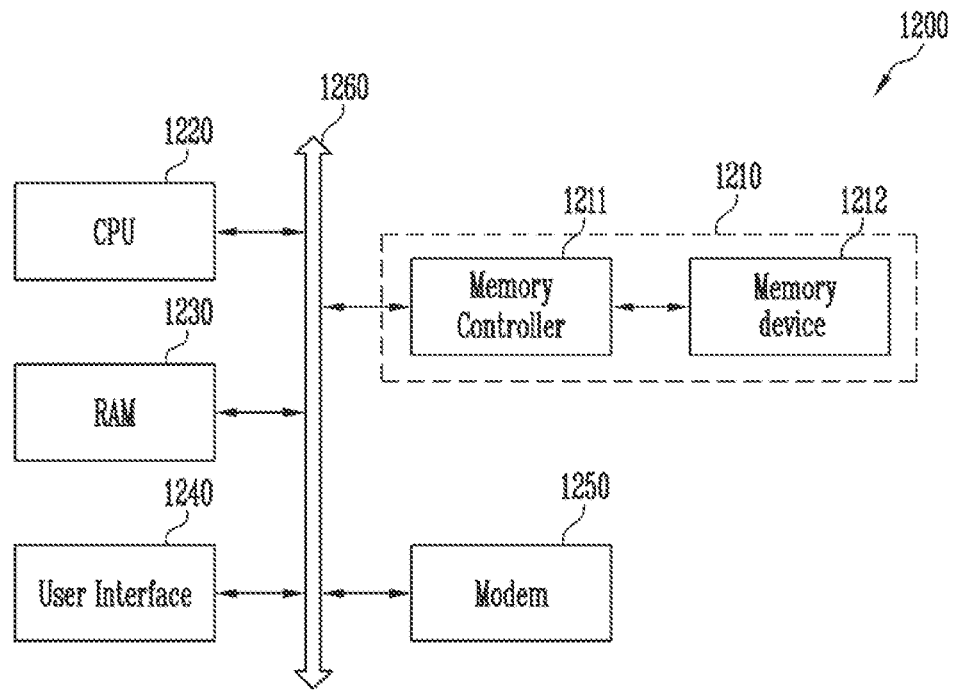
FIG. 15 is a block diagram illustrating the configuration of a computing system according to an embodiment.

FIG. 15 is a block diagram illustrating the configuration of a computing system 1200 according to an embodiment.

Referring to FIG. 15, the computing system 1200 may include a CPU 1220, Random Access Memory (RAM) 1230, a user interface 1240, a modem 1250, and a memory system 1210 that are electrically coupled to a system bus 1260. When the computing system 1200 is a mobile device, a battery for supplying an operation voltage to the computing system 1200 may be further included, and an application chipset, a camera image processor, a mobile DRAM, and the like may be further included.

The memory system 1210 may include a memory device 1212 and a memory controller 1211. The memory device 1212 may be configured in the same manner as the memory device 1120 described above with reference to FIG. 14. The memory controller 1211 may be configured in the same manner as the memory controller 1100 described above with reference to FIG. 14.

According to the present disclosure, noise due to coupling capacitance between upper wires and a bit line may be reduced by overlapping a shielding pattern and a bit line that is coupled to a memory cell array each other and disposing the upper wires in a higher level than the shielding pattern. Accordingly, according to the present disclosure, constraints on arrangement degree of freedom with respect to the upper wires may be reduced.

What is claimed is:

1. A semiconductor memory device, comprising:
   a channel structure extending from a lower source line;
   a gate stack structure including interlayer insulating layers and conductive patterns that surround the channel structure and are alternately stacked on each other;
   a lower source contact portion extending in parallel with the channel structure from the lower source line;
   a bit line overlapping the gate stack structure and coupled to the channel structure;
   a first upper source line coupled to the lower source contact portion; and
   a shielding pattern overlapping a bit line and extending to overlap the first upper source line.

2. The semiconductor memory device of claim 1, further comprising:
   a first insulating layer between the shielding pattern and each of the bit line and the first upper source line; and
   the second insulating layer covering the shielding pattern.

3. The semiconductor memory device of claim 2, further comprising a second upper source line disposed over the second insulating layer to overlap the bit line and the first upper source line.

4. A semiconductor memory device, comprising:
   a channel structure extending from a lower source line;
   a gate stack structure including interlayer insulating layers and conductive patterns that surround the channel structure and are alternately stacked on each other;
   a lower source contact portion extending in parallel with the channel structure from the lower source line;
   a bit line overlapping the gate stack structure and coupled to the channel structure:
   a first upper source line coupled to the lower source contact portion;
   an insulating structure covering the bit line and the first upper source line;
   a second upper source line disposed over the insulating structure to overlap the bit line and the first upper source line; and
   a shielding pattern embedded in the insulating structure, between the second upper source line and the bit line.

5. The semiconductor memory device of claim 4, further comprising a first contact pattern passing through the insulating structure and the shielding pattern and extending from the first upper source line towards the second upper source line.

6. The semiconductor memory device of claim 5, wherein the shielding pattern is in contact with and surrounds a sidewall of the first contact pattern.

7. The semiconductor memory device of claim 4, further comprising a plurality of second contact patterns passing through the insulating structure and extending from the shielding pattern towards the second upper source line.

8. The semiconductor memory device of claim 2, further comprising:
   a substrate disposed under the lower source line and including a logic circuit; and
   a power line electrically coupled to the logic circuit and disposed over the second insulating layer.

9. The semiconductor memory device of claim 4, further comprising:
   a substrate disposed under the lower source line and including a logic circuit; and
   a power line electrically coupled to the logic circuit and disposed over the insulating structure,
   wherein the power line includes a conductive material having lower resistance than the shielding pattern.

10. The semiconductor memory device of claim 3, further comprising:
   a substrate disposed under the lower source line and including a logic circuit; and
   a power line electrically coupled to the logic circuit and disposed over the second insulating layer,
   wherein the second upper source line includes a same conductive material as the power line.

* * * * *